(12) United States Patent
Le et al.

(10) Patent No.: US 9,628,062 B1
(45) Date of Patent: Apr. 18, 2017

(54) LOW POWER FLIP-FLOP CIRCUIT

(71) Applicant: NXP B.V., Eindhoven (NL)

(72) Inventors: Van-Loi Le, Singapore (SG);
Tae-Hyoung Kim, Singapore (SG);
Juhui Li, Singapore (SG); Alan Yeow Khai Chang, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/180,092

(22) Filed: Jun. 13, 2016

(51) Int. Cl.
*H03K 3/289* (2006.01)
*H03K 5/19* (2006.01)
*H03K 3/3562* (2006.01)

(52) U.S. Cl.
CPC ............. *H03K 5/19* (2013.01); *H03K 3/3562* (2013.01)

(58) Field of Classification Search
None
See application file for complete search history.

(56) References Cited

U.S. PATENT DOCUMENTS

| | | | |
|---|---|---|---|
| 6,522,184 B2 * | 2/2003 | Sato ................... | H03K 3/35625 327/203 |
| 7,868,677 B2 | 1/2011 | Jain | |
| 2007/0132496 A1* | 6/2007 | Kuboyama .......... | H03K 3/0375 327/218 |
| 2015/0207494 A1* | 7/2015 | Kim ................ | H03K 3/356139 327/218 |

OTHER PUBLICATIONS

D. Markovic, B. Nikolic, and R. Brodersen, "Analysis and Design of Low-energy Flip-Flops," Processing International Symposium. Low Power Electronics Design, pp. 52-55, Aug. 2001.
M. Nogawa and Y. Ohtomo, "A Data-Transition Look-Ahead DFF Circuit for Statistical Reduction in Power Consumption," IEEE Journal of Solid-State Circuits, vol. 33, No. 5, pp. 702-706, May 1998.
Yejoong Kim et al., "A Static Contention-Free Single-Phase-Clocked 24T Flip-Flop in 45nm for Low-Power Applications", 2014 IEEE International Solid-State Circuits Conference, pp. 466-467, Feb. 12, 2014.

(Continued)

*Primary Examiner* — Long Nguyen
(74) *Attorney, Agent, or Firm* — Charles E. Bergere

(57) ABSTRACT

A 24-transistor D flip-flop circuit operates in a sampling mode when a clock signal has a first voltage state, and a holding mode when the clock signal has a second voltage state. The flip-flop circuit includes an internal control node coupled to a reference voltage node by way of a transistor controllable to couple the internal control node to the reference voltage node when the clock signal has the second voltage state. The flip-flop has very low power dissipation as it includes a 4-transistor change-sense component to detect changes in input data. The change-sense component is coupled in series with the transistor and receives an indication of an input voltage state of the flip-flop circuit and an indication of an output voltage state of the flip-flop circuit, and inhibits toggling of the internal control node if the indicated input voltage state and the indicated output voltage state are the same.

20 Claims, 7 Drawing Sheets

(56) References Cited

OTHER PUBLICATIONS

Chen Kong Teh et al., "A 77% Energy-Saving 22-Transistor Single-Phase Clocking D-Flip-Flop with Adaptive Coupling Configuration in 40nm CMOS", 2011 IEEE International Solid-State Circuits Conference, Feb. 23, 2011.
Bo Wang et al., "A 0.18V Charge-Pumped DFF with 50.8% Energy-Delay Reduction for Near-/Sub-threshold Circuits," 2013 IEEE Asian Solid-State Circuits Conference, 2013.
Massimo Alioto, Elio Consoli and Gaetano Palumbo, "Analysis and Comparison in the Energy-Delay-Area Domain of Nanometer CMOS Flip-Flops: Part I—Methodology and Design Strategies," IEEE Transactions on Very Large Scale Integration (VLSI) Systems., vol. 19, No. 5, pp. 725-736, May 2011.
M. Alioto, E. Consoli, and G. Palumbo, "Analysis and comparison in the energy-delay-area domain of nanometer CMOS flip-flops: Part II—Results and figures of merit," IEEE Trans. Very Large Scale Integration (VLSI) Syst., vol. 19, No. 5, pp. 737-750, May 2011.

\* cited by examiner

LOW POWER FLIP-FLOP CIRCUIT

BACKGROUND

The present invention relates generally to integrated circuits and, more particularly, to a D-type flip-flop circuit.

FIG. 1 illustrates a conventional 24-transistor transmission gate flip-flop (TGFF) 100. The conventional TGFF 100 has eight inverters I1 to I8 and four transmission gates T1 to T4. Inverters I1, I4 and I5 and transmission gates T1 and T2 make up a master latch 110, while inverters I6, I7 and I8 and transmission gates T3 and T4 make up a slave latch 120. Two inverters I2 and I3 form a clock circuit for generating control signals CLKN and CLKI from a clock signal CLK for controlling the transmission gates T1 to T4.

When the clock signal CLK transitions to a low level, the first control signal CLKN goes high and the second control signal CLKI goes low. As a result, transmission gates T1 and T4 are turned on (i.e., become 'transparent' to signals at their inputs). Meanwhile transmission gates T2 and T3 are turned off (i.e., become 'impervious' to signals received at their inputs). Accordingly, when the clock signal CLK is low, the master latch 110 is in a transparent mode and new data is passed from the input D through inverter I1, transmission gate T1, inverter I4 and inverter I5 to the output of inverter I5. Conversely, the slave latch 120 is in a hold mode and the previous data is held in the slave latch 120 within the transmission gate T4 and inverters I6 and I7.

When the clock signal CLK transitions to a high level, the first control signal CLKN goes low and the second control signal CLKI goes high. As a result, transmission gates T2 and T3 are turned on, whereas the transmission gates T1 and T4 are turned off. Accordingly, when the clock signal CLK is high, the master latch 110 is in a hold mode and the new data received at the input D is held in the master latch 110 within inverters I4, I5 and transmission gate T2. Conversely, the slave latch 120 is in a transparent mode, and the new data held within the master latch 110 is passed to the output Q through transmission gate T3 and inverters I6 and I8.

The conventional TGFF 100 is robust over a wide operating supply voltage range. However, the conventional TGFF 100 has a large number of clocked nodes (two per transmission gate). Voltage signals at these clocked nodes always toggle with the clock signal CLK, irrespective of the data at the input D. Such toggling of internal nodes within the TGFF 100 consumes power. Significantly, each of the clocked nodes within the conventional TGFF 100 toggles in response to each transition of the clock signal CLK, even when the data at input D does not change. Accordingly, the conventional TGFF 100 consumes a significant amount of power as a result of the toggling of the clocked nodes, even when the data at the input D does not change.

FIG. 2 illustrates a static contention-free single-phase-clocked 24-transistor flip-flop (SSC-FF) 200, disclosed in the 2014 IEEE International Solid-State Circuits Conference (Y. Kim, et al., "A static Contention-Free Single-Phase-Clocked 24T Flip-Flop in 45 nm for Low Power Applications", ISSCC Dig. Tech. Papers, pp. 466-467, 2014).

For the SSC-FF 200, when the clock signal CLK goes low, an internal control node net1 goes high. The transistors M2 and M3 are turned on to pass the new data received at the input D to the output of the inverter M11/M12. Inverter M11/M12 forms part of a master latch, along with transistors M5 and M7. At the same time, M19 and M22 are on to keep the previous data in the slave latch, which comprises transistors M17, M18, M19, M20, M21 and M22.

When the clock signal CLK goes high, if the new data at the input D is low, the internal control node net1 goes low and keeps the new data in the master latch using transistor M5. In addition, a low internal control node net1 causes transistor M13 to be on, pulling node QN high and thus causing the output Q to go low via inverter M23/M24.

Conversely, if the clock signal CLK goes high when the new data at the input D is high, internal control node net1 is kept high through transistor M6. The data is held in the master latch by inverter M11/M12 and transistors M7 and M10. Meanwhile, transistors M14, M15 and M16 are turned on and pull node QN low, causing the output Q to go high via inverter M23/M24.

The SSC-FF 200 uses a clock-gate implementation including transistors M6, M8, M9, and M10 to avoid toggling of the internal control node net1 when the data at the input D is high. As a result, the SSC-FF 200 achieves lower power dissipation than the conventional TGFF 100 illustrated in FIG. 1 during periods when the input data stays high. However, the SSC-FF 200 suffers from the same high power dissipation as the conventional TGFF 100 when the input data stays low.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
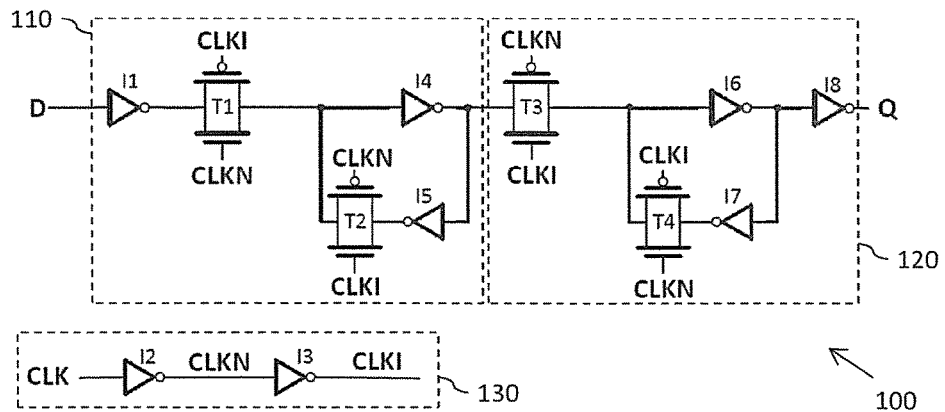
FIG. 1 is a schematic circuit diagram of a conventional 24-transistor transmission gate flip-flop.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises a" does not, without more constraints, preclude the existence of additional identical elements or steps that comprises the element or step.

In one embodiment, the present invention provides a D-type flip-flop circuit. The flip-flop circuit is arranged to receive a clock signal and to operate in a sampling mode when the clock signal comprises a first voltage state and in a holding mode when the clock signal comprises a second voltage state. The flip-flop circuit has internal control node controllably coupled to a first reference voltage node via a first transistor. The first transistor is controlled by the clock signal such that when the clock signal has the first voltage state, the first transistor decouples the internal control node from the first reference voltage node, and when the clock signal has the second voltage state, the first transistor couples the internal control node to the first reference voltage node. The flip-flop circuit further comprises a change-sense component coupled in series with the first transistor. The change-sense component receives at least one indication of a voltage state at an input of the flip-flop circuit and at least one indication of a voltage state at an output of the flip-flop circuit and inhibits the coupling of the internal control node to the first reference voltage node when the flip-flop circuit is operating in the holding mode if the indicated voltage state at the input of the flip-flop circuit and the indicated voltage state at the output of the flip-flop circuit are the same.

Advantageously, by receiving indications of the voltage states of both the input and the output of the flip-flop circuit, and inhibiting the coupling of the internal control node to the first reference voltage node when the flip-flop circuit is operating in the holding mode if the indicated voltage state at the input of the flip-flop circuit and the indicated voltage state at the output of the flip-flop circuit are the same, the change-sense component inhibits toggling of the internal control node of the flip-flop circuit when there is no change in the voltage state of the received data. As a result, unnecessary switching of transistors controlled by the internal control node is avoided, thereby reducing the power consumption of the flip-flop circuit during periods of unchanging data. Significantly, by inhibiting the toggling of the internal control node based on a comparison of the input and output voltage states of the flip-flop circuit, the reduction in power consumption may be achieved during periods of both high and low voltage states for the input signal.

Figure 3:
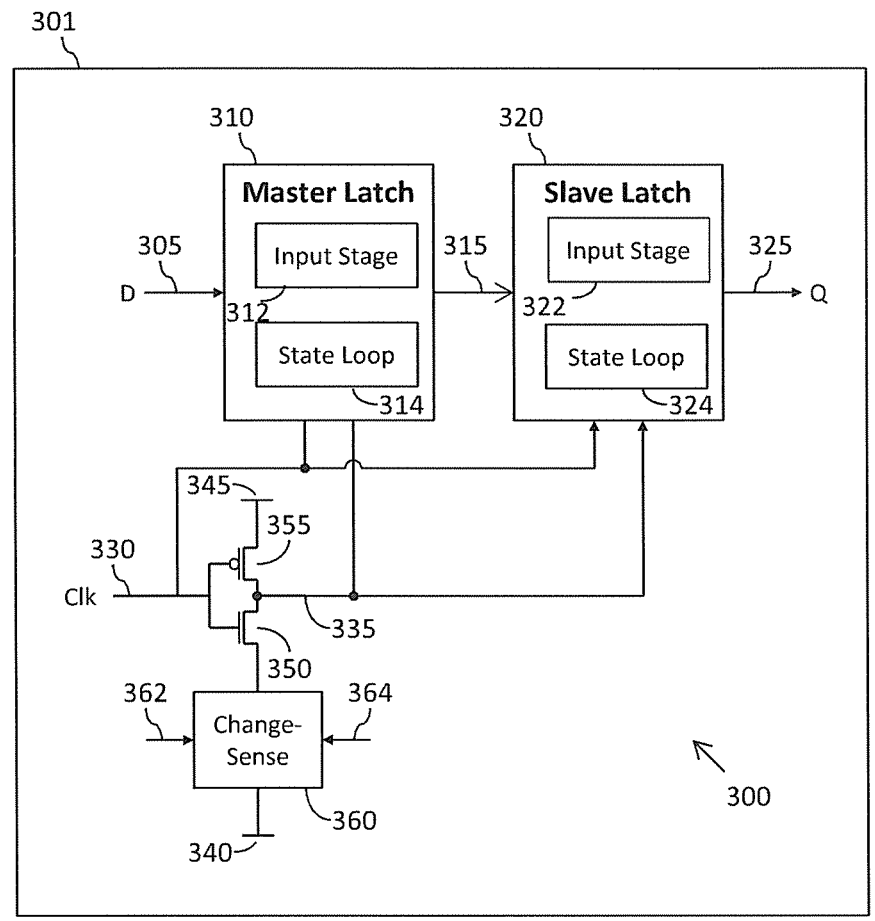
FIG. 3 is a schematic block diagram of an example of a flip-flop circuit in accordance with an embodiment of the present invention.

Referring now to FIG. 3, a simplified block diagram of an example of a flip-flop circuit 300, which for the illustrated example is implemented within a semiconductor device 301, is shown. The flip-flop circuit 300 comprises a master latch component 310 and a slave latch component 320. The flip-flop circuit 300 is arranged to receive a clock signal 330 and to operate in a sampling mode when the clock signal comprises a first voltage state (e.g., a low voltage state) and a holding mode when the clock signal comprises a second voltage state (e.g., a high voltage state). For example, when the flip-flop circuit 300 is operating in the sampling mode, the master latch component 310 will sample a voltage state at an input 305 of the flip-flop circuit 300 and the slave latch component 320 will hold and output a previously sampled voltage state. Conversely, when the flip-flop circuit 300 is operating in the holding mode, the master latch component 310 will hold and output 315 the voltage state sampled during the preceding sampling mode and the slave latch 320 component will sample and output the voltage state held by the master latch component 310.

The flip-flop circuit 300 comprises an internal control node 335 that provides a control signal for controlling transistors within the master and slave latch components 310 and 320, as described in greater detail below. The internal control node 335 is controllably coupled to a first reference voltage node 340 by way of a first transistor 350. In the embodiment shown, the first reference voltage node 340 comprises a low voltage node. The first transistor 350 is controlled by the clock signal 330 such that when the clock signal 330 has the first voltage state (i.e., when the flip-flop circuit 300 is in the sampling mode), the first transistor 350 is controlled to decouple the internal control node 335 from the first reference voltage node 340, and when the clock signal 330 comprises the second voltage state (i.e., when the flip-flop circuit 300 is in the holding mode), the first transistor 350 is controlled to couple the internal node 335 to the first reference voltage node 340.

The internal control node 335 is controllably coupled to a second reference voltage node 345 via a second transistor 355. In the embodiment shown, the second reference voltage node 345 comprises a high voltage node. The second transistor 355 is controlled by the clock signal 330 such that when the clock signal 330 comprises the first voltage state (i.e., when the flip-flop circuit 300 is in the sampling mode), the second transistor 355 is controlled to couple the internal control node 335 to the second reference voltage node 345, and when the clock signal 330 comprises the second voltage state (i.e., when the flip-flop circuit 300 is in the holding mode), the second transistor 355 is controlled to decouple the internal node 335 from the second reference voltage node 345.

In this manner, the voltage state of the control signal provided by the internal control node 335 is (at least partly) controlled by the clock signal 330. The clock signal 330 controls the first and second transistors 350, 355 to cause the internal control node 335 to comprise a voltage state opposite to that of the clock signal 330.

The flip-flop circuit 300 further comprises a change-sense component 360 coupled in series with the first transistor 350. The change-sense component 360 receives at least one indication 362 of a voltage state at the input 305 of the flip-flop circuit 300 and at least one indication 364 of a voltage state at the output 325 of the flip-flop circuit 300, and inhibits the coupling of the internal control node 335 to the first reference voltage node 340 when the flip-flop circuit 300 is operating in the holding mode if the indicated voltage state 362 at the input 305 of the flip-flop circuit 300 and the indicated voltage state 364 at the output 325 of the flip-flop circuit 300 are the same (i.e., when there is no change in the voltage state of the received data 305).

In this manner, when the flip-flop circuit 300 is in the sampling mode of operation (i.e., when the clock signal 330 comprises the first, low voltage state), the internal control node 335 is driven to a high voltage state by the second reference voltage node 345, by way of the second transistor 355. Conversely, when the flip-flop circuit 300 is in the holding mode of operation (i.e., when the clock signal 330 comprises the second, high voltage state), the first transistor 350 is controlled to couple the internal control node 335 to the first (low voltage) reference voltage node 340. If the voltage states at the input 305 and output 325 of the flip-flop circuit 300 are the same, the change-sense component 360 inhibits the coupling of the internal control node 335 to the first (low voltage) reference voltage node 340, thereby inhibiting the internal control node 335 from being driven to a low voltage state by the first reference voltage node 345. Thus, when the voltage states at the input 305 and output 325 of the flip-flop circuit 300 are the same (i.e., when there is no change in the voltage state of the received data 305) toggling of the internal control node 335 is inhibited by the change-sense component 360.

Conversely, if the voltage states at the input 305 and output 325 of the flip-flop circuit 300 are not the same (i.e., when there is a change of voltage state of the received data 305), the change-sense component 360 couples the internal control node 335 to the first (low voltage) reference voltage node 340, thereby allowing the internal control node 335 to be driven to a low voltage state by the first reference voltage node 345, and thus allowing the control signal provided by the internal control node 335 to toggle with the clock signal 330, and thus to control the respective transistors within the master latch component 310 and the slave latch component 320 to sample and hold the new input data 305.

In a presently preferred embodiment, the master latch component 310 comprises an input stage 312 and a state-holding stage 314, and the slave latch component 320 comprises an input stage 322 and a state-holding stage 324. When the flip-flop circuit 300 is in the sampling mode, the input stage 312 and the state-holding stage 314 are configured (by the clock signal 330 and the control signal provided by the internal control node 335) to be 'transparent' such that a voltage state of the input signal 305 is passed through the master latch component 310 and output at 315 to the slave latch component 320. In this manner, the master latch component 310 samples the voltage state of the input signal 305. Meanwhile, the input stage 322 of the slave latch component 320 is configured (by the clock signal 330 and the control signal provided by the internal control node 335) to be impervious to the output signal 315 of the master latch component 310, while the state holding stage 324 of the slave latch component 320 is configured (by the clock signal 330 and the control signal provided by the internal control node 335) to 'hold' and output a current voltage state.

Conversely, when the flip-flop circuit 300 is operating in the holding mode, the input stage 312 of the master latch component 310 is configured (by the clock signal 330 and the control signal provided by the internal control node 335) to be impervious to the input signal 305, whilst the state holding stage 314 of the master latch component 310 is configured (by the clock signal 330 and the control signal provided by the internal control node 335) to 'hold' and output 315 the previously sampled voltage state. Meanwhile, the input stage 322 and the state-holding stage 324 of the slave latch component 320 are configured (by the clock signal 330 and the control signal provided by the internal control node 335) to be 'transparent' such that the voltage state of the output signal 315 of the master latch component 310 is passed through the slave latch component 320 and output at 325. In this manner, the slave latch component 320 is arranged to sample the voltage state of the output signal 315 for the master latch component 310.

Notably, when there is no change in the voltage state of the received data 305, toggling of the control signal provided by the internal control node 355 is inhibited, thereby inhibiting switching of the respective transistors controlled thereby within the master latch component 310 and the slave latch component 320. However, because there is no change in the voltage state of the received data, no change of sampled voltage states within the master and slave latch components 310, 320 is required. Accordingly, and as described in greater detail below, inhibiting the switching of the respective transistors within the master and slave latch components 310, 320 need not adversely affect the operation of the flip-flop circuit 300.

Figure 4:
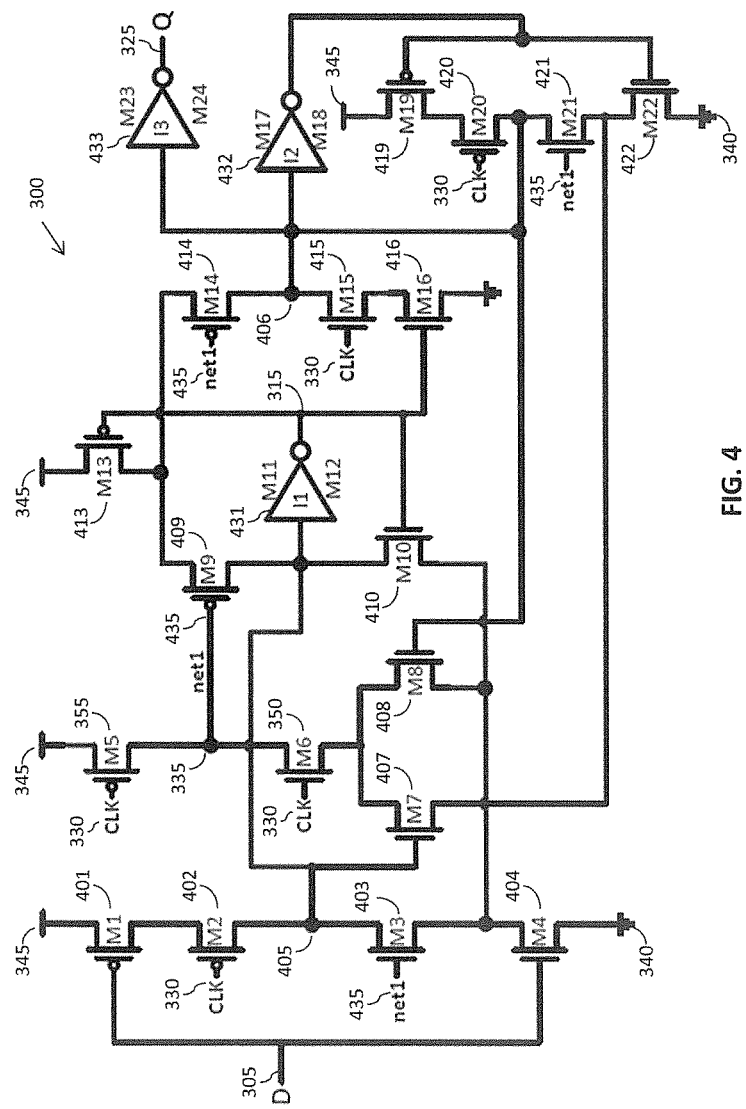
FIGS. 4 to 8 are schematic circuit diagrams of an example of the flip-flop circuit of FIG. 3.

Referring now to FIG. 4, a simplified circuit diagram of an example of the flip-flop circuit 300 of FIG. 3 is shown. For the example illustrated in FIG. 4, the input stage 312 of the master latch component 310 comprises four transistors M1 401, M2 402, M3 403 and M4 404. Transistors M1 401 and M2 402 consist of PMOS transistors coupled in series between the high voltage reference node 345 and an output node 405 of the input stage 312 of the master latch component 310, with PMOS M1 401 controlled by the input signal 305 and PMOS M2 402 controlled by the clock signal 330. Transistors M3 403 and M4 404 comprise NMOS transistors coupled in series between the low voltage reference node 340 and the output node 405 of the input stage 312 of the master latch component 310, with NMOS M4 404 controlled by the input signal 305 and NMOS M3 403 controlled by the control signal 435 provided by the internal control node 335.

The state holding stage 314 of the master latch component 310 consists of three transistors M13 413, M9 409, M10 410 and an inverter component I1 431. Transistors M13 413 and M9 409 consist of PMOS transistors coupled in series between an input of the inverter component I1 431 and the high voltage reference node 345. Transistor M10 410 consists of an NMOS transistor and is coupled in series with NMOS M4 404 between the input of the inverter component I1 431 and the low voltage reference node 340. The input of the inverter component I1 431 is coupled to the output 405 of the input stage 312 of the master latch component 310. The output of the inverter component I1 431 provides the output 315 of the master latch component 310. PMOS M13 413 and NMOS M10 410 are controlled by the output 315 of the inverter component I1 431, while PMOS M9 409 is controlled by the control signal 435 provided by the internal control node 335.

The input stage 322 of the slave latch component 320 consists of four transistors M13 413, M14 414, M15 415 and M16 416. Transistor M14 414 consists of a PMOS transistor coupled in series with PMOS M13 413 between the high voltage reference node 345 and an output node 406 of the input stage 322 of the slave latch component 320, with PMOS M13 413 controlled by the output signal 315 of the master latch component 310 and PMOS M14 414 controlled by the control signal 435 provided by the internal control node 335. Transistors M15 415 and M16 416 consist of NMOS transistors coupled in series between the low voltage reference node 340 and the output node 406 of the input stage 322 of the slave latch component 320, with NMOS M16 416 controlled by the output signal 315 of the master latch component and NMOS M15 415 controlled by the clock signal 330.

The state holding stage 324 of the slave latch component 320 consists of four transistors M19 419, M20 420, M21 421 and M22 422 and two inverter components I2 432 and I3 433. Transistors M19 419 and M20 420 consist of PMOS transistors coupled in series between an input of the inverter component I2 432 and the high voltage reference node 345. Transistors M21 421 and M22 422 consist of NMOS transistors coupled in series between the input of the inverter component I2 432 and the low voltage reference node 340. The input of the inverter component I2 432 is coupled to the output 406 of the input stage 322 of the slave latch component 320. PMOS M19 419 and NMOS M22 422 are controlled by the output of the inverter component I2 432, while PMOS M20 420 is controlled by the clock signal 330 and NMOS M21 421 is controlled by the control signal 435 provided by the internal control node 335. The input of the inverter component I3 433 is also coupled to the output 406 of the input stage 322 of the slave latch component 320. The output of the inverter component I3 433 provides the output 325 of the flip-flop circuit 300.

The change-sense component 360 comprises a first change-sense path comprising NMOS M4 404 and NMOS transistor M8 408 coupled in series between the (NMOS) transistor 350 and the low voltage reference node 340. NMOS M4 404 is controlled (directly) by the voltage state at the input node 305 of the flip-flop circuit 300. In this manner, NMOS transistor M4 404 is controlled (by the input signal 305) to couple NMOS transistor M8 408 to the low voltage reference node 340 when the input 305 of the flip-flop circuit 300 comprises a high voltage state and to decouple the NMOS transistor M8 408 from the low voltage reference node 340 when the input 305 of the flip-flop circuit 300 comprises a low voltage state.

Meanwhile, NMOS transistor M8 408 is controlled by the output node 406 of the input stage 322 of the slave latch component 320, the output node 406 of the input stage 322 of the slave latch component 320 providing an indication 364 of the voltage state at the output 325 of the flip-flop circuit 300. In this manner, NMOS transistors M8 408 and M4 404 are controlled to couple NMOS 350 to the low voltage reference node 340 when the output 325 of the flip-flop circuit 300 (provided by inverter component I3 433) comprises a low voltage state and the input 305 of the flip-flop circuit 300 comprises a high voltage state, and to decouple NMOS 350 from the low voltage reference node 340 either when the output 325 of the flip-flop circuit 300 (provided by inverter component I3 433) comprises a high voltage state or the input 305 of the flip-flop circuit 300 comprises a low voltage state.

The change-sense component 360 further comprises a second change-sense path comprising NMOS M22 422 and NMOS transistor M7 407 coupled in series between NMOS 350 and the low voltage reference node 340. NMOS M7 407 is controlled by a signal at the output node 405 of the input stage 312 of the master latch component 310, the output node 405 of the input stage 312 of the master latch component 310 providing an indication of a voltage state at the input 305 of the flip-flop circuit 300. In this manner, NMOS M7 407 is controlled to couple NMOS 350 to NMOS 422 when the input 305 of the flip-flop circuit 300 comprises a low voltage state and to decouple the NMOS 350 from the NMOS 422 when the input 305 of the flip-flop circuit 300 comprises a high voltage state. Meanwhile, NMOS M22 422 is controlled by the output of the inverter component I2 432, where the output of the inverter component I2 432 provides an indication of a voltage state at the output 325 of the flip-flop circuit 300. In this manner, the NMOS M22 422 and NMOS M7 407 are controlled to couple NMOS 350 to the low voltage reference node 340 when the output 325 of the flip-flop circuit 300 comprises a high voltage state and the input 305 of the flip-flop circuit 300 comprises a low voltage state, to decouple NMOS 350 from the low voltage reference node either when the output 325 of the flip-flop circuit 300 comprises a low voltage state or the input 305 of the flip-flop circuit 300 comprises a high voltage state.

FIGS. 5 to 8 illustrate the operation of the flip-flop circuit 300 of FIG. 4, whereby transistors that are turned off and inactive paths have been removed from the figures to help illustrate the operation of the flip-flop circuit 300 when a voltage state at the input 305 is stored on the rising-edge of the clock signal 330.

Figure 5:
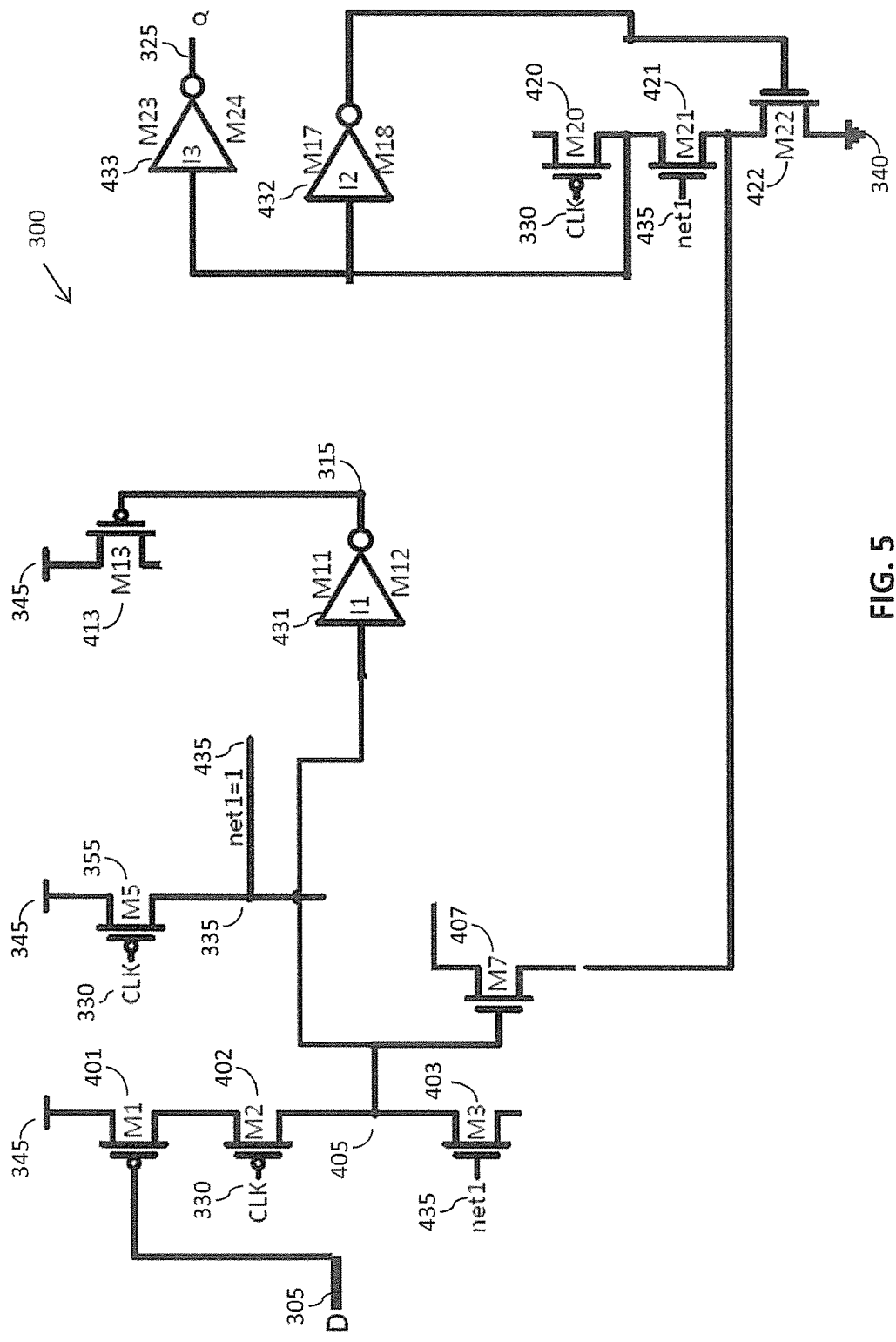

FIG. 5 illustrates the operation of the flip-flop circuit 300 when the clock signal 330 goes low, putting the flip-flop circuit 300 into a sampling mode, and the input 305 has changed from a high voltage state to a low voltage state. The low voltage state of the clock signal 330 turns transistor M5 355 on, causing the internal control node 335 to go high. The master latch component 310 is in transparent mode and the voltage state at the input 305 is passed through transistors M1 401, M2 402, and inverter component I1 431 to the output 315 of the master latch component 310. The slave latch component 320 is in a hold mode and the previous data is maintained within the loop formed by inverter component I2 432 and transistors M21 421 and M22 422. The low clock signal 330 and high internal control node 335 turn off transistors M14 414 and M15 415 to isolate the output 315 of the master latch component 310 from the state-holding stage 324 of the slave latch component 320.

Figure 6:
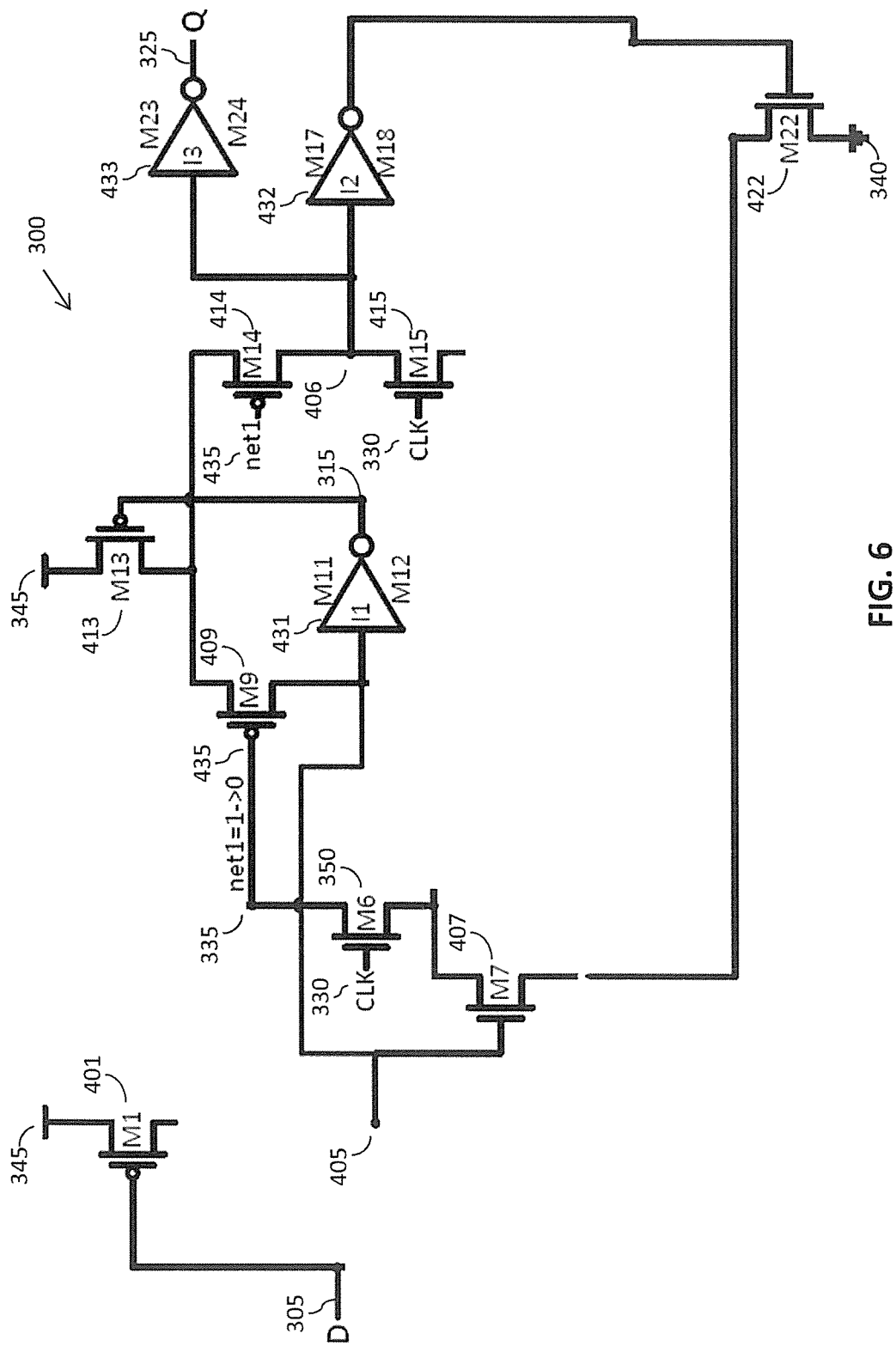

FIG. 6 illustrates the operation of the flip-flop circuit 300 when the clock signal 330 subsequently goes high, putting the flip-flop circuit 300 into a holding mode. Due to the change of the input data 305 from high to low, the voltage state at the input 305 and the voltage state at the output 325 are different. Accordingly, the change-sense component 360 enables the toggling of the internal control node 335. In particular, transistors M7 407 and M22 422 within the second change-sense path of the change-sense component 360 are both on due to the low voltage level of the input signal 305 and the high voltage level of the output signal 325. As a result, the transistor M6 350, which is also on due to the high voltage level of the clock signal 330, couples the internal control node 335 to the low voltage reference node 340, causing the internal control node 335 to toggle from a high voltage state to a low voltage state.

Meanwhile, transistors M3 403 and M2 402 are turned off by virtue of the high voltage level of the clock signal 330 and the low voltage level of the internal control node 335, isolating the input signal 315 from the state-holding stage 314 of the master latch component 310. The master latch component 310 is now in hold mode and the previously sampled data is held in the loop formed by inverter component I1 431 and transistors M9 409 and M13 413. The slave latch component 320 is in transparent mode, with the data held in the master latch component 310 passed through transistors M13 413 and M14 414 and inverter component I3 433 to the output 325 of the flip-flop circuit.

Figure 7:
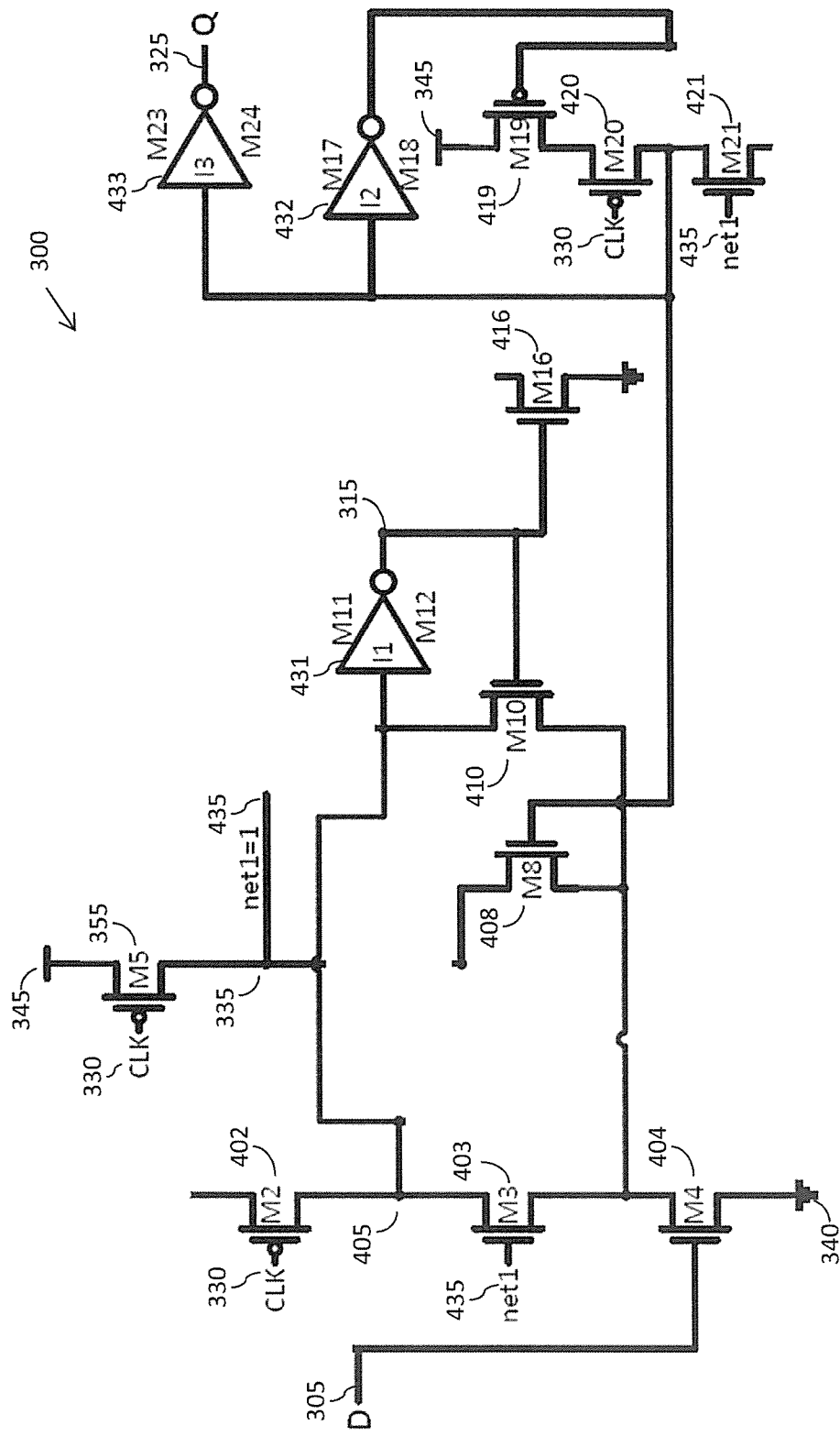

FIG. 7 shows the operation of the flip-flop circuit 300 when the clock signal 300 goes low, putting the flip-flop circuit 300 into a sampling mode, and the input 305 has changed from a low voltage state to a high voltage state. The internal control node 335 is pulled high by transistor M5 being turned on by the low state of the clock signal 330. The master latch component 310 is in transparent mode and the high voltage state at the input 305 is passed through transistors M3 403 and M4 404 and inverter component I1 431 to the output 315 of the master latch component 310. The slave latch component 320 is in hold mode and the previously sampled data is held in the loop formed by the inverter component I2 432 and transistors M19 419 and M20 420. The low clock signal 330 and high internal control node 335 turn off transistors M14 414 and M15 415 to isolate the output 315 of the master latch component 310 from the state-holding stage 324 of the slave latch component 320.

Figure 8:
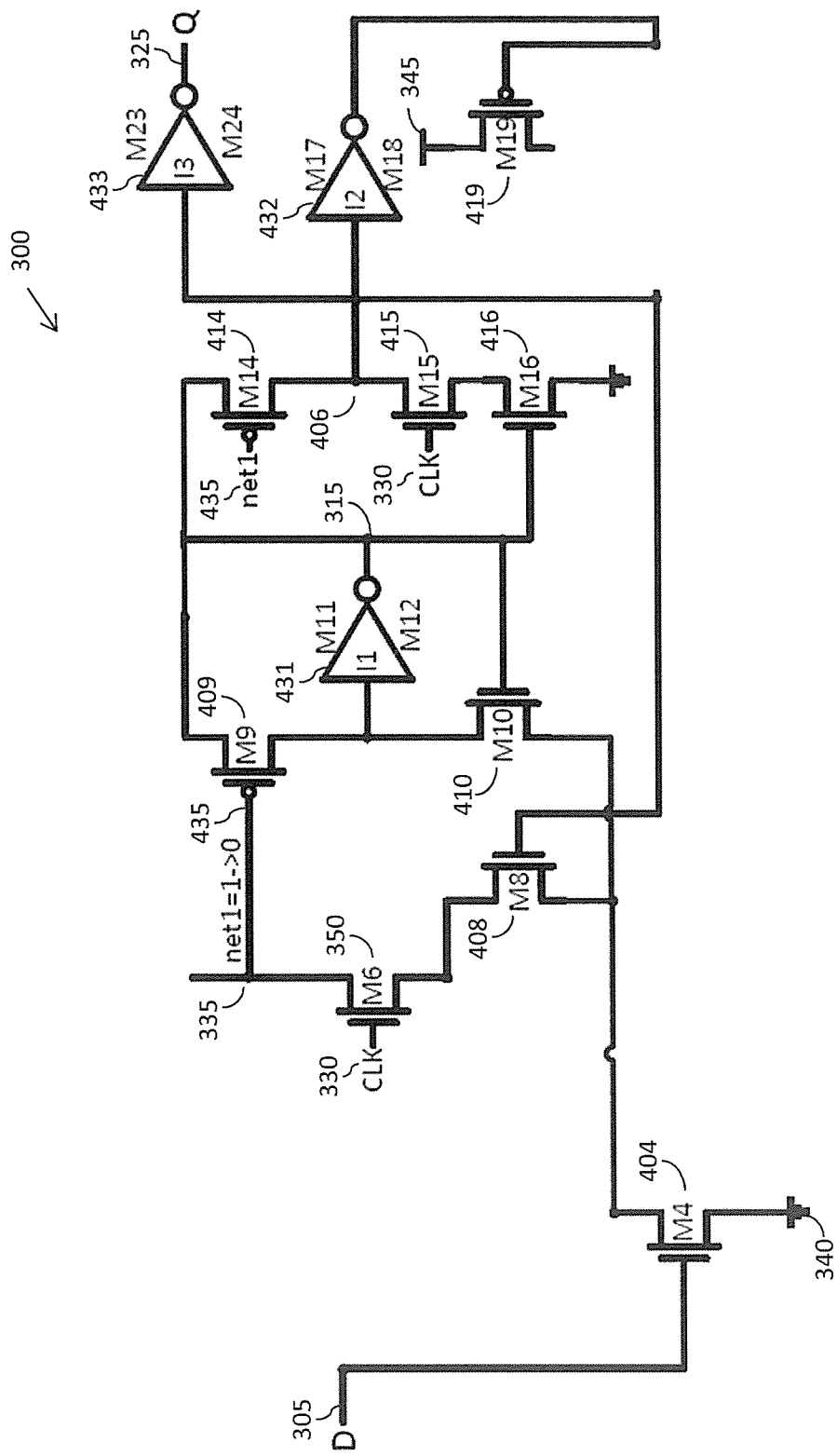

FIG. 8 illustrates the operation of the flip-flop circuit 300 when the clock signal 330 subsequently goes high, putting the flip-flop circuit 300 into a holding mode. Due to the change of the input data 305 from low to high, the voltage state at the input 305 and the voltage state at the output 325 are different. Accordingly, the change-sense component 360 enables the toggling of the internal control node 335. In particular, transistors M8 408 and M4 404 within the first change-sense path of the change-sense component 360 are both on due to the high voltage level of the input signal 305 and the low voltage level of the output signal 325. As a result, the transistor M6 350, which is also on due to the high voltage level of the clock signal 330, couples the internal control node 335 to the low voltage reference node 340, causing the internal control node 335 to toggle from a high to low.

If the voltage state at the input 305 remains constant, the input 305 and output 325 of the flip-flop circuit 300 will have the same voltage state. As a result, neither of the change-sense paths of the change-sense component 360 will be fully open, with one transistor within each path being turned off. For example, when the input 305 and output 325 have high voltage states, transistors M7 407 and M8 408 will be off. Conversely, when the input 305 and output 325 have low voltage states, transistors M4 404 and M22 422 will be off. Accordingly, the transistor M6 350 will be blocked from coupling the internal control node 335 to the low voltage reference node 340 when the flip-flop circuit 300 is in a holding mode, thereby inhibiting the toggling of the internal control node 335 from a high voltage state to a low voltage state. As a result, the internal control node 335 will remain high.

In the flip-flop circuit 300, the first transistor M6 350 coupled between the internal control node 335 and the first reference voltage node 340 comprises an NMOS transistor, while the second transistor M5 355 coupled between the internal control node 335 and the second reference voltage node 345 comprises a PMOS transistor. Transistor M4 404 (a 'third' transistor), forming part of the first change-sense path of the change-sense component 360, comprises an NMOS transistor having a gate terminal coupled to the input 305 of the flip-flop circuit 300. Transistor M8 408 (a 'fourth' transistor), also forming part of the first change-sense path of the change-sense component 360, comprises an NMOS transistor having a gate terminal coupled to the output node of the input stage 322 of the slave latch component 320 of the flip-flop circuit 300.

The input stage 312 of the master latch component 310 comprises a first transistor pair consisting of the third transistor M4 404 coupled between the output node 405 of the input stage 312 of the master latch component 410 and the first reference voltage node 340, and the PMOS transistor M1 401 coupled between the output node 405 of the input stage 312 of the master latch component 310 and the second reference voltage node 345. The first transistor pair has gate terminals coupled to the input 305 of the flip-flop circuit 300. The input stage 312 of the master latch component 310 further comprises a second pair of transistors consisting of NMOS transistor M3 403 coupled in series with the third transistor M4 404 between the output node 405 of the input stage 312 of the master latch component 310 and the first reference voltage node 340, and PMOS transistor M2 402 coupled in series with PMOS transistor M1 401 between the output node 405 of the input stage 312 of the master latch component 310 and the second reference voltage node 345, the NMOS transistor M3 403 and PMOS transistor M2 402 of the second pair of transistors having gate terminals coupled to the internal control node 355 and the clock signal 330 respectively. Notably, by sharing the third transistor (i.e. NMOS transistor M4 404) between the input stage 312 of the master latch component 310 and the first change-sense path of the change-sense component 360, the number of transistors required to implement the flip-flop circuit 300 may be reduced.

Furthermore, the state-holding stage 314 of the master latch component 310 comprises the inverter component I1 431 comprising an input coupled to the input of the state-holding stage 314 of the master component 310. The state-holding stage 314 further comprises the third transistor M4 404 and the NMOS transistor M10 410 coupled in series between the input node of the state-holding stage 314 and the first reference voltage node 340, and the PMOS transistors M13 413 and M9 409 coupled in series between the input node of the state-holding stage 314 and the second reference voltage node 345. In this manner, the third transistor M4 404 is shared with the state-holding stage 314, further reducing the number of transistors required to implement the flip-flop circuit 300.

The PMOS transistor M13 413 also forms a part of the input stage 322 of the slave latch component 320, being coupled between the output node 406 of the input stage 322 of the slave latch component 320 and the second reference voltage node 345. In this manner, the PMOS transistor M13 413 is shared between the state-holding stage 314 of the master latch component 310 and the input stage 322 of the slave latch component 320, further reducing the number of transistors required to implement the flip-flop circuit 300.

In a preferred embodiment, the transistor M7 407 (a 'fifth' transistor), forms part of the second change-sense path of the change-sense component 360, and comprises an NMOS transistor having a gate terminal coupled to the output node 405 of the input stage 312 of the master latch component 310. Transistor M22 422 (a 'sixth' transistor), also forms part of the second change-sense path of the change sense component 360, and comprises an NMOS transistor having a gate terminal coupled to the output of the inverter component I2 432 within the state-holding stage 324 of a slave latch component 320.

Furthermore, the state-holding stage 324 of the slave latch component 320 comprises the inverter component I2 432 comprising an input coupled to the input node of the state-holding stage 324 of the slave latch component 320. The state-holding stage 324 of the slave latch component 320 further comprises the sixth transistor M22 422 and the NMOS transistor M21 421 coupled in series between the input node of the state-holding stage 324 of the slave latch component 320 and the first reference voltage node 340, and the PMOS transistors M19 419 and M20 420 coupled in series between the input node of the state-holding stage 324 of the slave latch component 320 and the second reference voltage node 345. In this manner, the sixth transistor M22 422 is shared between the state-holding stage 324 of the slave latch component 320 and the second change-sense path of the change-sense component 360, further reducing the number of transistors required to implement the flip-flop circuit 300.

Figure 2:
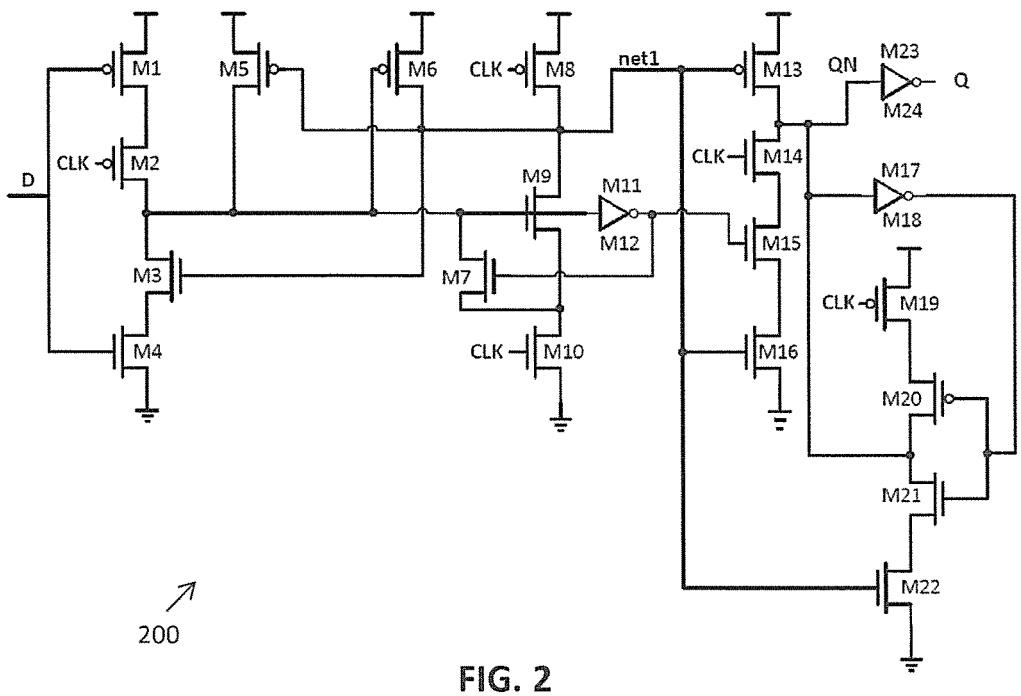
FIG. 2 is a schematic circuit diagram of a conventional static contention-free single-phase-clocked 24-transistor flip-flop.

Notably, the flip-flop circuit 300 may be implemented using twenty-four transistors, the same number of transistors required to implement the conventional 24-transistor transmission gate flip-flop 100 illustrated in FIG. 1 and to implement the static contention-free single-phase-clocked 24 transistor flip-flop 200 illustrated in FIG. 2. As such, the flip-flop circuit 300 avoids unnecessary switching of transistors controlled by the internal control node 355, thereby reducing the power consumption of the flip-flop circuit 300, during periods of unchanging data for both high and low voltage states at the input signal, without requiring an increase in the number of transistors.

In a scenario when the clock signal 330 is gated (i.e., held) in a high voltage level and the input 305 of the flip-flop circuit 300 remains at a low voltage state, the internal control node 335 will be a floating node with an initial high voltage state causing transistor M3 403 to be turned on, along with transistor M4 404. As a result, the output node 405 of the input stage 312 of the master latch component 310 will initially be pulled to a low voltage state through transistors M3 403 and M4 404. However, current leakage will cause the floating node voltage of the internal control node 335 to drop overtime, eventually resulting in the high voltage state of the internal control node 335 dropping to a low voltage stage if the clock signal 330 and input signal 305 remain unchanged for a sufficiently long period of time. As a result, transistor M3 403 will switch off, causing the output node 405 to become a floating node, and thus for the input of the inverter component I1 431 to become a floating node. Such a scenario in which the input of the inverter component I1 431 is floating could result in DC currents within the inverter component I1 431.

Figure 9:
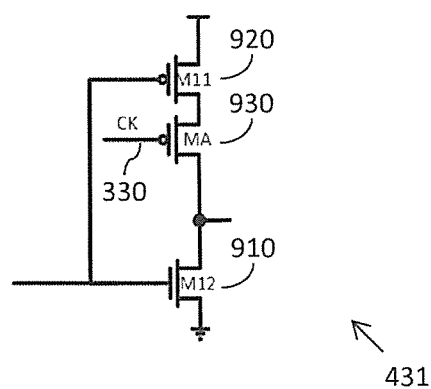
FIG. 9 is a simplified circuit diagram of an example of an inverter component of the flip-flop circuit of the present invention.

Accordingly, in some example embodiments an additional transistor may be included within the inverter component I1 431, coupled between an output node of the inverter component I1 431 and the second reference voltage node 345, and having a gate terminal coupled to the clock signal 330. For example, and as illustrated in FIG. 9, the inverter component I1 431 comprises an NMOS transistor 910 coupled between an output of the inverter component I1 431 and the first reference voltage node 340, and having a gate terminal coupled to the input of the inverter component I1 43. The inverter component I1 431 also has a PMOS transistor 920 coupled between the output of the inverter component I1 431 and the second reference voltage node 435, and having a gate terminal coupled to the input of the inverter component I1 431. In the example illustrated in FIG. 9, the inverter component I1 431 further comprises an additional PMOS transistor 930 coupled in series with the first PMOS transistor 920 between the output of the inverter component I1 431 and the second reference voltage node 345, and having a gate terminal coupled to the clock signal 330.

In this manner, the additional transistor is arranged to isolate the output node of the inverter component I1 431 from the second reference voltage node 345 when the clock signal 330 is held high, thereby preventing DC current flow through the inverter component I1 431 in a scenario when the clock signal 330 is gated (i.e., held) at a high voltage level and the input 305 of the flip-flop circuit 300 remains at a low voltage state.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A flip-flop circuit that receives a clock signal and operates in a sampling mode when the clock signal comprises a first voltage state and in a holding mode when the clock signal comprises a second voltage state, the flip-flop circuit comprising:
   a first transistor;
   an internal control node controllably coupled to a first reference voltage node by way of the first transistor, wherein the first transistor is controllable by the clock signal such that when the clock signal comprises the first voltage state the first transistor decouples the internal control node from the first reference voltage node, and when the clock signal comprises the second voltage state the first transistor couples the internal control node to the first reference voltage node;
   a change-sense component coupled in series with the first transistor, wherein the change-sense component receives at least one indication of a voltage state at an input of the flip-flop circuit and at least one indication of a voltage state at an output of the flip-flop circuit to inhibit the coupling of the internal control node to the first reference voltage node when the flip-flop circuit is operating in the holding mode if the indicated voltage state at the input of the flip-flop circuit and the indicated voltage state at the output of the flip-flop circuit are the same.

2. The flip-flop circuit of claim 1, further comprising a second transistor, wherein the internal control node is controllably coupled to a second reference voltage node by way of the second transistor, wherein the second transistor is controllable by the clock signal such that when the clock signal comprises the first voltage state the second transistor couples the internal control node to the second reference voltage node, and when the clock signal comprises the second voltage state the second transistor decouples the internal control node from the second reference voltage node.

3. The flip-flop circuit of claim 1, wherein the change-sense component comprises:
   a first change-sense path comprising a third transistor and a fourth transistor coupled in series between the first transistor and the first reference voltage node, the third transistor being controlled to couple the first transistor to the first reference voltage node when the input of the flip-flop circuit comprises a high voltage state and to decouple the first transistor from the first reference voltage node when the input of the flip-flop circuit comprises a low voltage state, and the fourth transistor being controlled to couple the first transistor to the first reference voltage node when the output of the flip-flop circuit comprises a low voltage state and to decouple the first transistor from the first reference voltage node when the output of the flip-flop circuit comprises a high voltage state; and
   a second change-sense path comprising a fifth transistor and a sixth transistor coupled in series between the first transistor and the first reference voltage node, the fifth transistor being controlled to couple the first transistor to the first reference voltage node when the input of the flip-flop circuit comprises a low voltage state and to decouple the first transistor from the first reference voltage node when the input of the flip-flop circuit comprises a high voltage state, and the sixth transistor being controlled to couple the first transistor to the first reference voltage node when the output of the flip-flop circuit comprises a high voltage state and to decouple the first transistor from the first reference voltage node when the output of the flip-flop circuit comprises a low voltage state.

4. The flip-flop circuit of claim 3, wherein:
   the third transistor comprises an NMOS transistor having a gate terminal coupled to the input of the flip-flop circuit, and
   the fourth transistor comprises an NMOS transistor having a gate terminal coupled to an output node of an input stage of a slave latch component of the flip-flop circuit.

5. The flip-flop circuit of claim 3, further comprising a master latch component, wherein an input stage of the master latch component of the flip-flop circuit comprises:

a first transistor pair comprising the third transistor coupled between an output node of the input stage of the master latch component and the first reference voltage node, and a first PMOS transistor coupled between the output node of the input stage of the master latch component and the second reference voltage node, the first transistor pair having gate terminals coupled to the input of the flip-flop circuit; and a second transistor pair comprising a first NMOS transistor coupled in series with the third transistor between the output node of the input stage of the master latch component and the first reference voltage node, and a further PMOS transistor coupled in series with the first PMOS transistor of the first transistor pair between the output node of the input stage of the master latch component and the second reference voltage node, wherein the first NMOS transistor and the further PMOS transistor of the second transistor pair have gate terminals coupled to the internal control node and the clock signal respectively.

6. The flip-flop circuit of claim 5, wherein the master latch component further comprises a state-holding stage, comprising:

an inverter component having an input coupled to an input of the state-holding stage of the master component;

the third transistor further coupled between the input node of the state-holding stage of the master latch component and the first reference voltage node having a gate terminal coupled to the input of the flip-flop circuit;

a further NMOS transistor coupled in series with the third transistor between the input node of the state-holding stage of the master latch component and the first reference voltage node and having a gate terminal coupled to an output of the inverter component of the state-holding stage of the master latch component;

a second PMOS transistor coupled between the input node of the state-holding stage of the master latch component and the second reference voltage node and having a gate terminal coupled to an output of the inverter component of the state-holding stage of the master latch component; and a second further PMOS transistor coupled in series with the second PMOS transistor of the state-holding stage of the master latch component and having a gate terminal coupled to the internal control node.

7. The flip-flop circuit of claim 6, wherein the first PMOS transistor of the state-holding stage of the master latch component forms a part of the input stage of the slave latch component, and is further coupled between an output node of the input stage of the slave latch component and the second reference voltage node.

8. The flip-flop circuit of claim 7, wherein the inverter component of the state-holding stage of the master latch component comprises:

a second NMOS transistor coupled between an output of the inverter component of the state-holding stage of the master latch component and the first reference voltage node, and having a gate terminal coupled to the input of the inverter component of the state-holding stage of the master latch component;

a third PMOS transistor coupled between the output of the inverter component of the state-holding stage of the master latch component and the second reference voltage node, and having a gate terminal coupled to the input of the inverter component of the state-holding stage of the master latch component; and a fourth PMOS transistor coupled in series with the third PMOS transistor between the output of the inverter component of the state-holding stage of the master latch component and the second reference voltage node, and having a gate terminal coupled to the clock signal.

9. The flip-flop circuit of claim 3, wherein:

the fifth transistor comprises an NMOS transistor having a gate terminal coupled to an output node of an input stage of a master latch component of the flip-flop circuit, the sixth transistor comprises an NMOS transistor having a gate terminal coupled to an output of an inverter component within a state-holding stage of a slave latch component of the flip-flop circuit, and a signal at the output of the inverter component is representative of the output of the flip-flop circuit.

10. The flip-flop circuit of claim 9, wherein the state-holding stage of the slave latch component comprises:

the inverter component having an input coupled to an input node of the state-holding stage of the slave latch component;

the sixth transistor further coupled between the input node of the state-holding stage of the slave latch component and the first reference voltage node, and having its gate terminal coupled to the output of the inverter component of the state-holding stage of the slave latch component;

an NMOS transistor coupled in series with the sixth transistor between the input node of the state-holding stage of the slave latch component and the first reference voltage node and having a gate terminal coupled to the internal control node;

a first PMOS transistor coupled between the input node of the state-holding stage of the slave latch component and the second reference voltage node and having a gate terminal coupled to the output of the inverter component of the state-holding stage of the slave latch component; and a further PMOS transistor coupled in series with the first PMOS transistor and having a gate terminal coupled to the clock signal.

11. A semiconductor device comprising at least one flip-flop circuit, wherein the at least one flip-flop circuit is arranged to receive a clock signal and to operate in a sampling mode when the clock signal comprises a first voltage state and in a holding mode when the clock signal comprises a second voltage state, wherein the at least one flip-flop circuit comprises:

a first transistor;

an internal control node controllably coupled to a first reference voltage node by way of the first transistor, wherein the first transistor is controllable by the clock signal such that when the clock signal has the first voltage state the first transistor decouples the internal control node from the first reference voltage node, and when the clock signal has the second voltage state the first transistor couples the internal control node to the first reference voltage node; and a change-sense component coupled in series with the first transistor, wherein the change-sense component receives at least one indication of a voltage state at an input of the flip-flop circuit and at least one indication of a voltage state at an output of the flip-flop circuit, and inhibits the coupling of the internal control node to the first reference voltage node when the flip-flop circuit is operating in the holding mode if the indicated voltage state at the input of the flip-flop circuit and the indicated voltage state at the output of the flip-flop circuit are the same.

12. The semiconductor device of claim 11, wherein the at least one flip-flop circuit further comprises a second transistor, wherein the internal control node is controllably coupled to a second reference voltage node by way of the second transistor, and the second transistor is controllable by the clock signal such that when the clock signal has the first voltage state the second transistor couples the internal control node to the second reference voltage node, and when the clock signal has the second voltage state the second transistor decouples the internal control node from the second reference voltage node.

13. The semiconductor device of claim 12, wherein the change-sense component comprises:
a first change-sense path comprising a third transistor and a fourth transistor coupled in series between the first transistor and the first reference voltage node, the third transistor being controlled to couple the first transistor to the first reference voltage node when the input of the flip-flop circuit comprises a high voltage state and to decouple the first transistor from the first reference voltage node when the input of the flip-flop circuit comprises a low voltage state, and the fourth transistor being controlled to couple the first transistor to the first reference voltage node when the output of the flip-flop circuit comprises a low voltage state and to decouple the first transistor from the first reference voltage node when the output of the flip-flop circuit comprises a high voltage state; and
a second change-sense path comprising a fifth transistor and a sixth transistor coupled in series between the first transistor and the first reference voltage node, the fifth transistor being controlled to couple the first transistor to the first reference voltage node when the input of the flip-flop circuit comprises a low voltage state and to decouple the first transistor from the first reference voltage node when the input of the flip-flop circuit comprises a high voltage state, and the sixth transistor being controlled to couple the first transistor to the first reference voltage node when the output of the flip-flop circuit comprises a high voltage state and to decouple the first transistor from the first reference voltage node when the output of the flip-flop circuit comprises a low voltage state.

14. The semiconductor device of claim 13, wherein:
the third transistor comprises an NMOS transistor having a gate terminal coupled to the input of the flip-flop circuit, and
the fourth transistor comprises an NMOS transistor having a gate terminal coupled to an output node of an input stage of a slave latch component of the flip-flop circuit.

15. The semiconductor device of claim 13, wherein the at least one flip-flop has a master latch component, wherein an input stage of the master latch component comprises:
a first transistor pair comprising the third transistor coupled between an output node of the input stage of the master latch component and the first reference voltage node and a first PMOS transistor coupled between the output node of the input stage of the master latch component and the second reference voltage node, the first transistor pair having gate terminals coupled to the input of the flip-flop circuit; and
a second transistor pair comprising a first NMOS transistor coupled in series with the third transistor between the output node of the input stage of the master latch component and the first reference voltage node, and a further PMOS transistor coupled in series with the first PMOS transistor of the first pair of transistors between the output node of the input stage of the master latch component and the second reference voltage node, the first NMOS transistor and further PMOS transistor having gate terminals coupled to the internal control node and the clock signal respectively.

16. The semiconductor device of claim 15, wherein the master latch component further comprises a state-holding stage, the state-holding stage comprising:
an inverter component having an input coupled to an input node of the state-holding stage of the master latch component;
the third transistor further coupled between the input node of the state-holding stage of the master latch component and the first reference voltage node, and having a gate terminal coupled to the input of the flip-flop circuit;
a further NMOS transistor coupled in series with the third transistor between the input node of the state-holding stage of the master latch component and the first reference voltage node and having a gate terminal coupled to an output of the inverter component of the state-holding stage of the master latch component;
a second PMOS transistor coupled between the input node of the state-holding stage of the master latch component and the second reference voltage node, and having a gate terminal coupled to the output of the inverter component of the state-holding stage of the master latch component; and
a third PMOS transistor coupled in series with the first PMOS transistor of the state-holding stage of the master latch component, and having a gate terminal coupled to the internal control node.

17. The semiconductor device of claim 16, wherein the second PMOS transistor of the state-holding stage of the master latch component forms a part of an input stage of a slave latch component, and is further coupled between an output node of the input stage of the slave latch component and the second reference voltage node.

18. The semiconductor device of claim 17, wherein the inverter component of the state-holding stage of the master latch component comprises:
a second NMOS transistor coupled between an output of the inverter component and the first reference voltage node, and having a gate terminal coupled to the input node of the inverter component;
a fourth PMOS transistor coupled between the output of the inverter component and the second reference voltage node, and having a gate terminal coupled to the input of the inverter component; and
a fifth PMOS transistor coupled in series with the fourth PMOS transistor between the output of the inverter component and the second reference voltage node, and having a gate terminal coupled to the clock signal.

19. The semiconductor device of claim 13, wherein:
the fifth transistor comprises an NMOS transistor having a gate terminal coupled to an output node of an input stage of a master latch component of the flip-flop circuit;
the sixth transistor comprises an NMOS transistor having a gate terminal coupled to an output of an inverter component within a state-holding stage of a slave latch component of the flip-flop circuit; and a signal at the output of the inverter component is representative of the output of the flip-flop circuit.

20. The semiconductor device of claim 19, wherein the state-holding stage of the slave latch component comprises:
the inverter component comprising an input coupled to an input node of the state-holding stage of the slave latch component;
the sixth transistor further coupled between the input node of the state-holding stage of the slave latch component and the first reference voltage node, and having its gate terminal coupled to the output of the inverter component;
a further NMOS transistor coupled in series with the sixth transistor between the input node of the state-holding stage of the slave latch component and the first reference voltage node, and having a gate terminal coupled to the internal control node;
a first PMOS transistor coupled between the input node of the state-holding stage of the slave latch component and the second reference voltage node, and having a gate terminal coupled to the output of the inverter component; and
a further PMOS transistor coupled in series with the first PMOS transistor of the state-holding stage of the slave latch component, and having a gate terminal coupled to the clock signal.

* * * * *